United States Patent
Van Keulen et al.

(10) Patent No.: US 11,774,865 B2
(45) Date of Patent: Oct. 3, 2023

(54) METHOD OF CONTROLLING A POSITION OF A FIRST OBJECT RELATIVE TO A SECOND OBJECT, CONTROL UNIT, LITHOGRAPHIC APPARATUS AND APPARATUS

(71) Applicant: ASML Netherlands B.V., Veldhoven (NL)

(72) Inventors: Thijs Adriaan Cornelis Van Keulen, Eindhoven (NL); Hendrikus Herman Marie Cox, Eindhoven (NL); Ramidin Izair Kamidi, Eindhoven (NL); Willem Herman Gertruda Anna Koenen, Roermond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/636,765

(22) PCT Filed: Jul. 24, 2020

(86) PCT No.: PCT/EP2020/070979
§ 371 (c)(1),
(2) Date: Feb. 18, 2022

(87) PCT Pub. No.: WO2021/037453
PCT Pub. Date: Mar. 4, 2021

(65) Prior Publication Data
US 2022/0299889 A1    Sep. 22, 2022

(30) Foreign Application Priority Data
Aug. 23, 2019    (EP) .................................... 19193366

(51) Int. Cl.
*G03F 7/20*    (2006.01)
*G03F 7/00*    (2006.01)
(Continued)

(52) U.S. Cl.
CPC ...... *G03F 7/70725* (2013.01); *G03F 7/70216* (2013.01); *G03F 9/7003* (2013.01); *H01L 21/682* (2013.01)

(58) Field of Classification Search
CPC ............. G03F 7/70725; G03F 7/70216; G03F 9/7003; G03F 7/7085; H01L 21/682
See application file for complete search history.

(56) References Cited

U.S. PATENT DOCUMENTS

| 4,631,416 A | 12/1986 | Trutna, Jr. |
| 5,191,465 A * | 3/1993 | Yamashita ............ G03F 9/7049 359/566 |

(Continued)

FOREIGN PATENT DOCUMENTS

EP    1 146 395 A2    10/2001

OTHER PUBLICATIONS

International Search Report and Written Opinion of the International Searching Authority directed to related International Patent Application No. PCT/EP2020/070979, dated Nov. 9, 2020; 11 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

A method of determining a desired relative position between a first object of a lithographic apparatus and a second object of the lithographic apparatus. Generating a measurement signal representing a position of the first object relative to the second object, at an initial relative position. Determining a gradient associated with the initial relative position, based on the measurement signal. Determining a position set point based on the gradient and wherein the position set point comprises a three-dimensional dither signal. Controlling the (Continued)

position of the first object relative to the second object to a further relative position, based on the position set point.

20 Claims, 7 Drawing Sheets

(51) Int. Cl.
*G03F 9/00* (2006.01)
*H01L 21/68* (2006.01)

(56) References Cited

U.S. PATENT DOCUMENTS

| | | | |
|---|---|---|---|
| 6,020,964 | A | 2/2000 | Loopstra et al. |
| 6,952,253 | B2 | 10/2005 | Lof et al. |
| 2004/0238758 | A1 | 12/2004 | Antonius Theodorus Dams |
| 2007/0058173 | A1 | 3/2007 | Holzapfel |
| 2010/0106328 | A1 | 4/2010 | Li et al. |
| 2013/0320244 | A1 | 12/2013 | Frihauf et al. |
| 2016/0132027 | A1 | 5/2016 | Li et al. |
| 2017/0241658 | A1 | 8/2017 | Salsbury et al. |
| 2018/0267515 | A1 | 9/2018 | House et al. |
| 2018/0284701 | A1 | 10/2018 | Salsbury et al. |
| 2018/0299839 | A1 | 10/2018 | Salsbury et al. |
| 2019/0041077 | A1 | 2/2019 | Salsbury et al. |
| 2019/0137952 | A1 | 5/2019 | Salsbury et al. |

OTHER PUBLICATIONS

International Preliminary Report on Patentability directed to related International Patent Application No. PCT/EP2020/070979, dated Feb. 17, 2022; 8 pages.

Van Der Weijst, et al., "A generalized framework for perturbation-based derivative estimation in multivariable extremum-seeking," IFAC Papers Online, vol. 50, No. 1, Jul. 1, 2017; 6 pages.

Van Der Weijst et al., "Constrained multivariable extremum-seeking for online fuel-efficiency optimization of Diesel engines," Control Engineering Practice, vol. 87, Jun. 11, 2019; 14 pages.

* cited by examiner

METHOD OF CONTROLLING A POSITION OF A FIRST OBJECT RELATIVE TO A SECOND OBJECT, CONTROL UNIT, LITHOGRAPHIC APPARATUS AND APPARATUS

CROSS-REFERENCE TO RELATED APPLICATION

The application claims priority of EP application 19193366.2 which was filed on Aug. 23, 2019 and which is incorporated herein in its entirety by reference.

FIELD

The present invention relates to a method of controlling a position of a first object relative to a second object, in particular to a method of determining a desired relative position of a first object of a lithographic apparatus and a second object of a lithographic apparatus. The invention further relates to a control unit that is configured to facilitate such a method, a stage apparatus for performing such a method and a lithographic apparatus configured to perform such a method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In order to accurately perform the above described patterning or exposure process, the various components or objects as applied in the lithographic apparatus need to co-operate. In order to obtain a desired functionality, it is often desired that a particular spatial relationship or relative position exists between components or objects in the lithographic apparatus, or that a particular relative position needs to be obtained. In order to achieve this, calibration or initialisation methods have been developed to e.g. determine a desired relative position of two objects inside a lithographic apparatus. Such calibration or initialisation methods may however be rather time-consuming and/or insufficiently accurate.

SUMMARY

It is an objective of the present invention to provide an alternative method of determining a desired relative position between a first object and a second object of a lithographic apparatus.

According to an aspect of the present invention, there is provided a method of determining a desired relative position between a first object of a lithographic apparatus and a second object of the lithographic apparatus, the method comprising:
  a. generating a measurement signal representing a position of the first object relative to the second object, at an initial relative position;
  b. determining a gradient associated with the initial relative position, based on the measurement signal;
  c. determining a position set point based on the gradient and wherein the position set point comprises a three-dimensional dither signal;
  d. controlling the position of the first object relative to the second object to a further relative position, based on the position set point.

According to another aspect of the present invention, there is provided a control unit for controlling a relative position between a first object of a lithographic apparatus and a second object of a lithographic apparatus, the control unit being configured to:
  a. receive, at an input terminal of the control unit, a measurement signal representing a position of the first object relative to the second object, at an initial relative position;
  b. determine a gradient associated with the initial relative position, based on the measurement signal;
  c. determine a position set point, based on the gradient and wherein the position set point includes a three-dimensional dither signal;
  d. output, at an output terminal of the control unit, a control signal configured to control the position of the first object relative to the second object to a further relative position, the control signal being based on the position set point.

According to yet another aspect of the invention, there is provided a lithographic apparatus comprising:
  a first object;
  a second object;
  a control unit according to the invention.

According to yet another aspect of the invention, there is provided a lithographic apparatus, a metrology apparatus, an inspection apparatus, a particle beam apparatus, or a particle beam inspection apparatus which includes a control unit according to the present invention or a stage apparatus according to the present invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
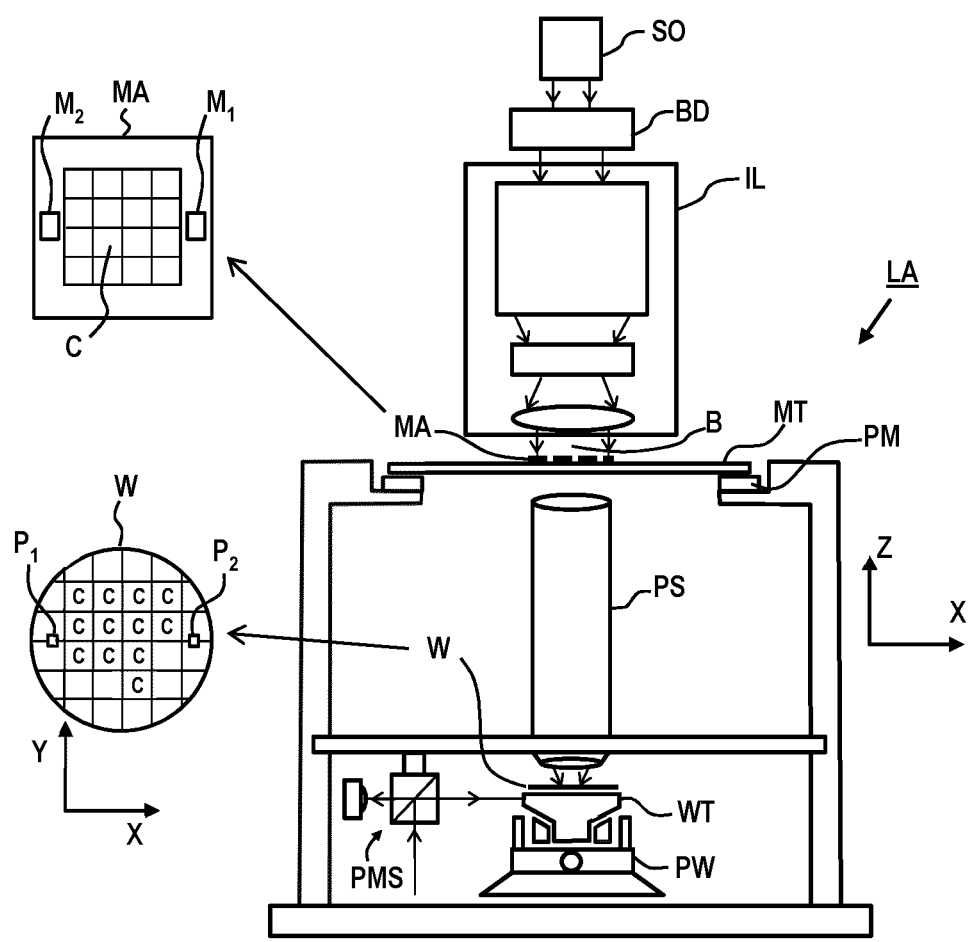
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
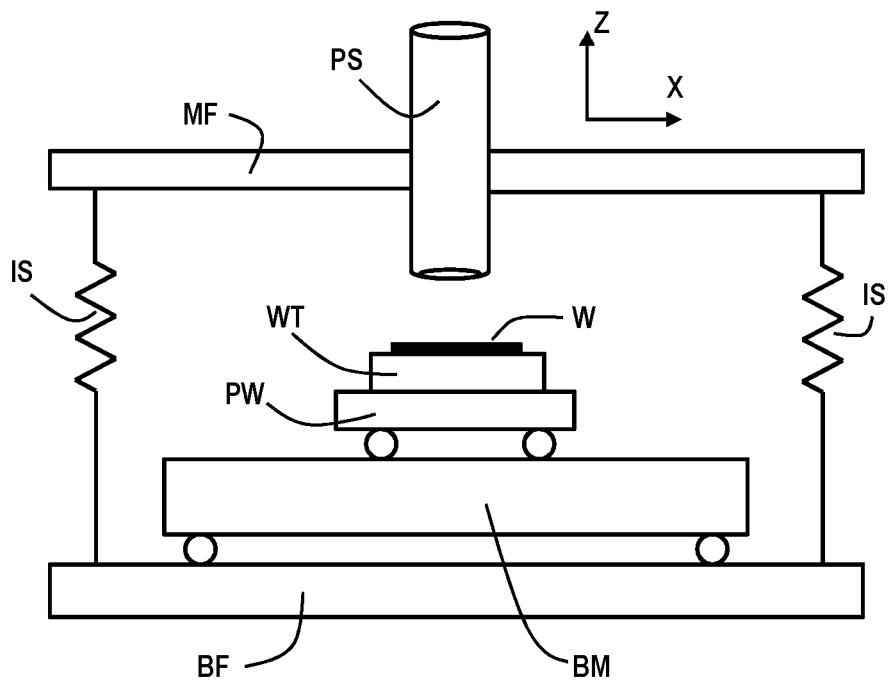
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
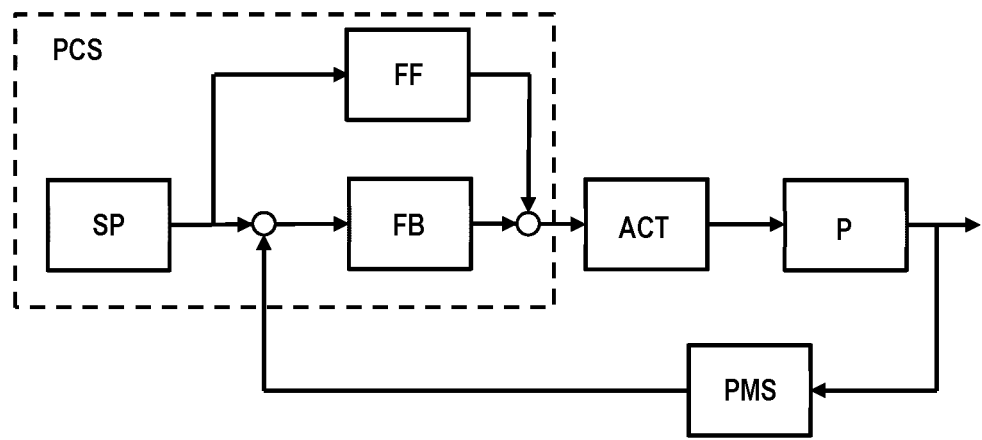
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

In order to accurately perform the patterning process or exposure process as described above, the spatial relationship between the various components or objects of the lithographic apparatus may need to be known or controlled. In particular, a specific relative position between two or more components or objects of the lithographic apparatus may be required, in order to achieve a particular functionality.

Within the meaning of the present invention, a component or object of the lithographic apparatus may refer to a component or object that either facilitates the processes performed by the lithographic apparatus such as optical elements or positioning devices and/or components or objects that are subject to these processes, such as patterning devices or substrates.

The following examples illustrate the need to accurately know or control a relative position between components or objects of a lithographic apparatus:

As a first example, the relative position between a patterning device and a stage apparatus or stage holding a substrate can be mentioned. In order to accurately project a patterned radiation beam, e.g. imparted by a patterning device, onto a substrate, the position of the patterning device relative to the substrate needs to be accurately known and controlled. In order to do so, a reference position of the patterning device relative to the stage apparatus is typically established. Once this position is established, the relative position between the patterning device and the substrate can be controlled.

As a second example, a relative position of two optical components of the lithographic apparatus can be mentioned. In order to accurately project a patterned radiation beam, e.g. imparted by a patterning device, onto a substrate, a particular spatial intensity distribution of the radiation beam or the patterned radiation beam may be required. As discussed above, an illuminator or illumination system IL may be applied to condition the radiation beam. Such conditioning may e.g. require an accurate positioning of the optical components of the illumination system IL, such components e.g. including mirrors or lenses. In a similar manner, the projection system PS as described above may be configured to condition the patterned radiation beam to obtain a desired spatial and angular intensity distribution. This may equally require an accurate knowledge and control of the relative position of the optical components as applied in the projection system.

As such, at various locations inside a lithographic apparatus, objects or components may need to be brought into a desired or required relative position, either before or during the lithographic patterning process. The desired or required relative position may e.g. be a position whereby both objects are aligned in one or more degrees of freedom.

Figure 4:
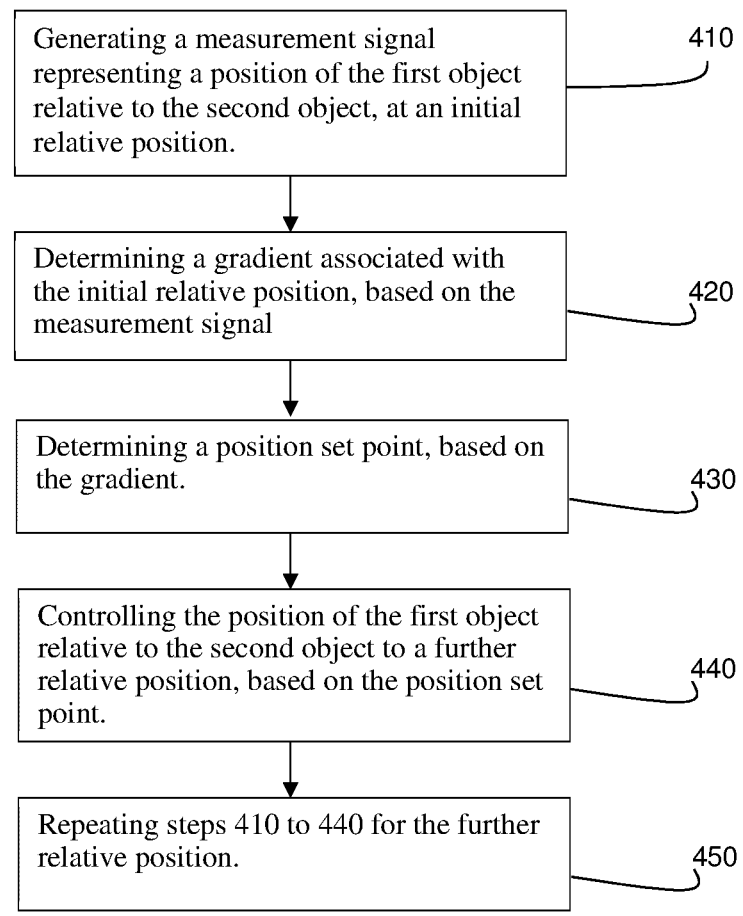
FIG. 4 depicts a flow-chart of a method according to the present invention.

In order to facilitate this, the present invention provides, in an embodiment, a method of determining a desired relative position between a first object of a lithographic apparatus and a second object of the lithographic apparatus. The method according to the present invention may be applied to determine a relative position between the first object and the second object in one or more degrees of freedom, e.g. up to 6 degrees of freedom. FIG. 4 schematically illustrates a flow-chart 400 of said method. In a first step 410, the method according to the present invention comprises generating a measurement signal representing a position of the first object relative to the second object, at an initial relative position. In an embodiment, as will be detailed below, the measurement signal may e.g. be an intensity of a radiation beam or measurement beam that is measured by an alignment sensor. In an embodiment, the measurement signal may comprise a plurality of different measurement signals, measured by one or more sensors. Such measurement signals may e.g. be obtained at various locations.

In the first step 410 of the method according to the present invention, a measurement signal is generated that represents a position of the first object relative to the second object, at an initial relative position. Such an initial relative position may e.g. correspond to the relative position of the objects at the end of a previous process that was performed. Alternatively, the initial relative position may correspond to a predetermined reference position whereby one or more of the objects is e.g. in a docking position, or a fixed position relative to a reference such as a reference frame. In an embodiment of the present invention, the method according to the present invention is applied to achieve an accurate alignment of two objects, an accurate alignment e.g. referring to an alignment having an accuracy of a few nm or less, e.g. less than 2 nm, preferably less than 1 nm, more preferably well below 1 nm, e.g. below 100 pm. In such embodiment, the method according to the present invention may be preceded by a coarse alignment procedure, whereby the objects are e.g. aligned, in one or more degrees of freedom, using a coarse alignment procedure, e.g. an alignment procedure having an accuracy of a few μm or less.

In a second step 420 of the method according to the invention, a gradient associated with the initial relative position is determined, based on the measurement signal. In an embodiment of the present invention, the gradient may be a gradient of the measurement signal with respect to the position. Within the meaning of the present invention, a gradient with respect to a position is also referred to as a position gradient. A position gradient in x, y and z directions may thus be indicated as $$\left(\frac{\partial}{\partial x}, \frac{\partial}{\partial y}, \frac{\partial}{\partial z}\right).$$

In case the gradient is a position gradient of the measurement signal associated with the initial relative position, the gradient thus characterises how the measurement signal varies with respect to the position, e.g. in one or more directions or dimensions. In such embodiment, as will be explained in more detail below, the method according to the present invention may determine the desired relative position as a position at which the measurement signal has an optimum, i.e. either a minimum or a maximum. In another embodiment of the present invention, the desired relative position between the first object and the second object is represented by an optimum of a cost function (CF). In such embodiment, the gradient or position gradient may comprise a gradient of the cost function. In such embodiment, as will be explained in more detail below, the method according to the present invention may determine the desired relative position as a position at which the cost function has an optimum, i.e. either a minimum or a maximum. The gradient as described above may also be considered a first order derivative. It can be pointed out that, although the invention is described using such a first order derivative, use may also be made of higher order derivatives in embodiments of the present invention, in order to determine a desired or required relative position of two objects.

In a third step 430 of the method according to the present invention, a position set point is determined, based on the gradient. In accordance with the present invention, the position set point may comprise a position set point for either one of the first object and the second object or for both objects. The position set point as determined refers to the position to which the first object and/or the second object have to be displaced, in view of the gradient.

In a fourth step 440 of the method according to the present invention, the position of the first object relative to the second object is controlled to a further relative position, based on the position set point. In accordance with the present invention, the step of controlling the position of the first object relative to the second object to a further relative position can be achieved by either controlling a position of the first object, or controlling a position of the second object, or controlling a position of both the first object and the second object.

In an embodiment, the step of controlling a position of an object may e.g. involve determining a control signal for controlling a positioning device that is configured to displace or position the object. Such a position device may e.g. comprise one or more actuators such as electromagnetic or piezo-electric actuators or one or more motors.

By controlling the position of the first object relative to the second object to a further relative position based on a position set point that has been determined using a gradient of the measurement signal or of a cost function, the further relative position will correspond better to the desired relative position.

In an embodiment, the method according to the present invention further comprises a fifth step 450 of repeating the steps 410 to 440 for the further relative position. In such embodiment, the steps 410 to 440 may e.g. be repeated for a number of times or until a criterion is met. Various criteria can be used to control the number of iterations or repetitions of the steps 410 to 440. As a first example, the iteration or repetition step 450 can be stopped after a predetermined number of iterations. As a second example, the iteration or repetition step 450 can be stopped after a predetermined period. As a third example, the iteration or repetition step 450 can be stopped when the gradient becomes lower than a predetermined threshold. Regarding the latter example, it can be pointed out that a low value of the gradient implies that the relative position for which the gradient is determined, is close to the relative position where the measurement signal has an optimum or where the cost function has an optimum.

In the method according to the present invention, as e.g. illustrated in step 410 of flow-chart 400 of FIG. 4, a measurement signal is generated that represents the relative position of both objects. In an embodiment of the present invention, the measurement signal may characterise or represent a degree of alignment or misalignment of both objects. Within the meaning of the present invention, an alignment or aligned position of the first object and the second object can be considered as an example of a desired relative position between the first object and the second object. As such, a measurement signal representing a degree of alignment between both objects can also be considered indicative of whether the relative position corresponds to the desired relative position or not.

In an embodiment of the present invention, the step of generating a measurement signal representing a position of the first object relative to the second object may therefore comprise generating a measurement signal representing a degree of alignment between both objects. Such a measurement signal may also be referred to as an alignment signal. Such an alignment signal may e.g. be generated using an alignment sensor.

In an embodiment of the present invention, the measurement signal, or alignment signal, is generated by:
Emitting a measurement beam towards the first object or the second object, and
Measuring an intensity of a modified measurement beam, the modified measurement beam being modified by both the first object and the second object.

In such embodiment, the measured intensity can be considered as the generated measurement signal. In such embodiment, the measurement beam as emitted, e.g. using a light source or radiation source, can be modified to the modified measurement beam by interacting with the first object and the second object. In an embodiment, said interaction may involve an interaction with a grating or a marking of the objects or mounted to the objects. Such an interaction may e.g. involve the measurement beam being transmitted through the grating or marking or being reflected by the grating or marking. Alternatively or in addition, the interaction of the first and/or second object with the measurement beam may involve any other type of modification to the measurement beam, such as reflecting the measurement beam or modifying the shape of the measurement beam.

Figure 5:
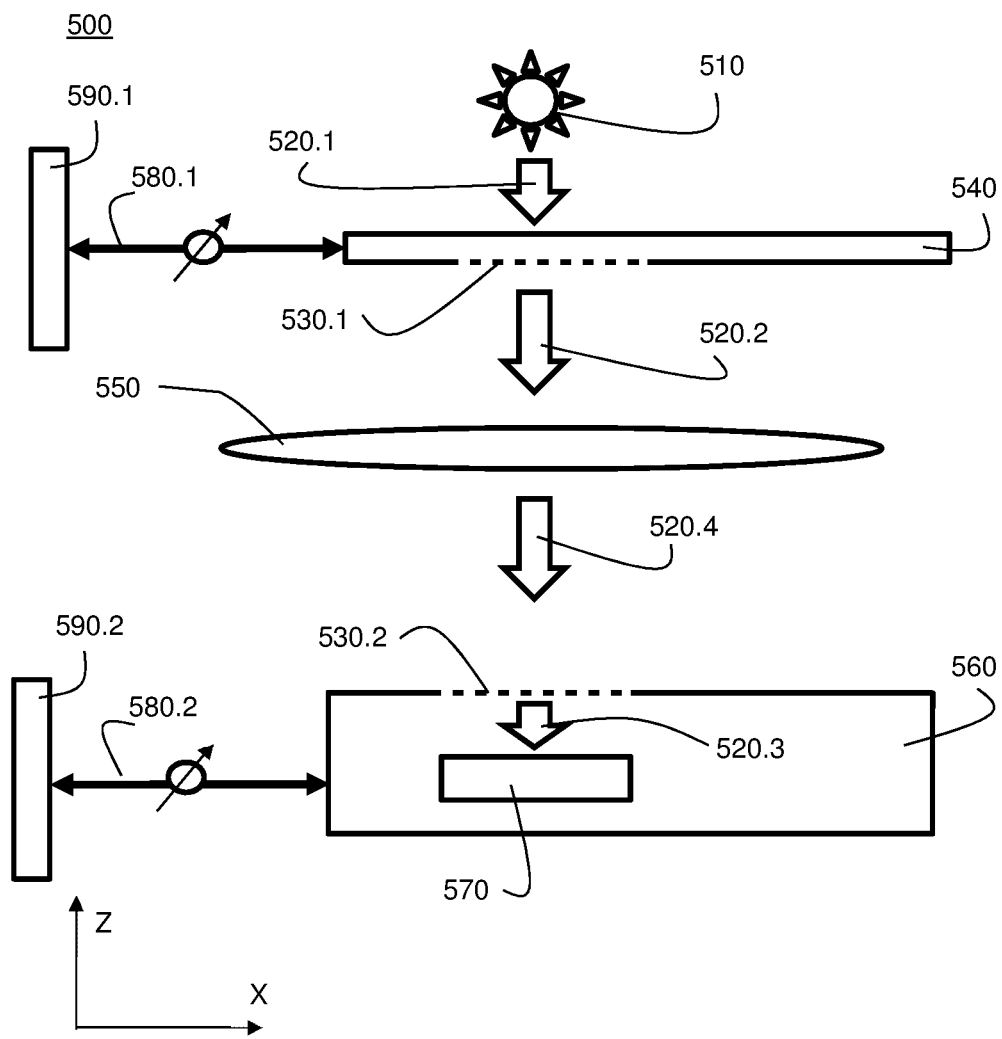
FIG. 5 depicts a possible implementation of the method according to the invention.

FIG. 5 schematically illustrates a measurement arrangement as can be applied in the present invention to generate a measurement signal representing a relative position between a first object and a second object. The measurement arrangement 500 as schematically shown comprises a light source 510 configured to emit a measurement beam 520.1 to a first grating 530.1, said first grating 530.1 being mounted to a first object 540 or being part of said first object 540. In the embodiment as shown, the measurement beam 520.1 is transmitted through the grating 530.1 and the modified measurement beam 520.2, i.e. modified by the grating 530.1, is directed towards an optional optical system 550, e.g. a projection system of a lithographic apparatus, and from the optical system 550, indicated by the arrow 520.4, towards a second grating 530.2, said second grating 530.2 being mounted to a second object 560 or being part of said second object 560. In the embodiment as shown, the modified measurement beam 520.2/520.4 is transmitted through the grating 530.2 and the modified measurement beam 520.3, i.e. modified by the grating 530.2, is received by a radiation sensor 570, e.g. a radiation sensor that is sensitive to the radiation or light emitted by the light source 510. In the embodiment as shown, a first position measurement system 580.1 is schematically shown, said position measurement system 580.1 being configured to measure a position of the first object 540 relative to a first reference or first reference frame 590.1. The embodiment as shown further comprises a second position measurement system 580.2 that is configured to measure a position of the second object 560 relative to a second reference or second reference frame 590.2. The position measurement systems 580.1 and 580.2 may be configured to measure the object's position in one or more degrees of freedom, e.g. in 6 degrees of freedom. As will be appreciated by the skilled person, the intensity of the light or radiation as received by the radiation sensor 570 will depend on the position of the first object 540 relative to the second object 560. In particular, when the second object 560, or the first object 540 is displaced along the indicated X-axis, the received intensity will vary. Similar gratings may be arranged extending in the Y-direction, the Y-direction being perpendicular to the indicated XZ-plane, resulting in a varying intensity for a displacement in the Y-direction as well. In case an optical system such as the optical system 550 is present, the intensity as received may also depend on the Z-position of the object or objects, i.e. along the indicated Z-axis. As such, for a given position of the first object 540, there may be a particular position for the second object 560 in which the intensity as received by the radiation sensor 570 is optimized, e.g. maximised. This particular position may e.g. correspond to the desired relative position of the first object 540 and the second object 560. Such desired relative position may e.g. correspond to a position whereby the first grating 530.1 and the second grating 530.2 are aligned. Such desired relative position may thus also be referred to as an aligned position. More details on how to determine said aligned position are provided below.

In an embodiment of the present invention, the first object 540 as schematically shown in FIG. 5 may e.g. be a patterning device MA as described above, said patterning device e.g. comprising a grating. In such embodiment, the second object 560 as schematically shown may e.g. correspond to a substrate support such as substrate support WT as described above.

In the method according to the present invention, as e.g. illustrated in step 420 of the flow-chart 400 of FIG. 4, a gradient associated with a relative position of the objects is determined, based on the measurement signal. In order to determine a gradient, in particular a position gradient, of a signal or function, one needs to know a value for the signal or the function in a least two positions.

In an embodiment of the present invention, the gradient may be determined by generating the measurement signal while changing the relative position between the first object and the second object. In such embodiment, the changing of the relative position between the first object and the second object can be realised by controlling a position of the first object relative to the second object using a time-dependent set point.

In an alternative embodiment of the present invention, the gradient may be determined by generating the measurement signal while changing a relative position of an optical element with respect to the first object and the second object. In such embodiment, the changing of the relative position of the optical element with respect to the first object and the second object can be realised by using a time-dependent setpoint.

In an embodiment of the present invention, such a time-dependent set-point is generated by superimposing a time-varying signal, e.g. a periodic signal onto a position set point. Such a periodic signal may also be referred to as a dither signal. The periodic signal or dither signal that is superimposed on a position set point that is applied to control a position of the first object and/or the second object results in the actual position of the controlled object(s) to vary, in accordance with the periodic signal or dither signal. As a result, the measurement signal, e.g. the intensity as received by a radiation sensor 570, will vary as well. In such an arrangement, the gradient or position gradient can be determined for a particular relative position, based on the applied periodic signal or dither signal and the corresponding varying measurement signal.

Figure 6:
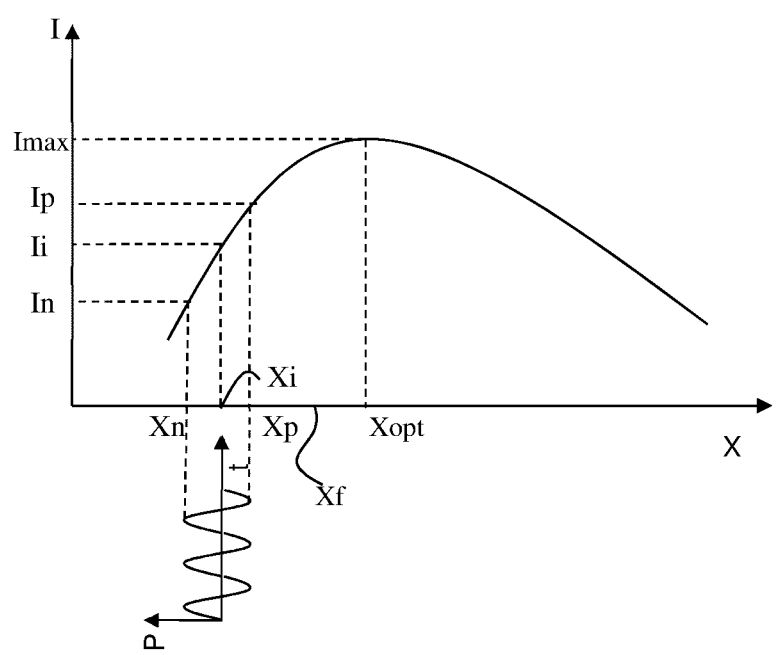
FIG. 6 depicts a measurement signal as a function of a relative position between two objects of a lithographic apparatus.

This is schematically illustrated in FIG. 6. FIG. 6 schematically illustrates a measurement signal I, e.g. an intensity as measured by radiation sensor 570 of FIG. 5, as a function of the X-position of the second object 560, for a given, fixed X-position of the first object 540. As such, an X-position of the second object 560 can be considered to represent a relative position between the first object 540 and the second object 560. In the graph as shown, position Xi is thus assumed to represent an initial relative position of the objects. When the object 560 is in position Xi, an intensity Ii is measured. It is further assumed that the optimal or desired relative position corresponds to the X-position Xopt, i.e. the X-position resulting in the maximum intensity Imax. When the object 560 is controlled in such a manner that the position is varied between positions Xn and Xp, e.g. by varying the position set point of the object according to the graph P(t) over time, the measured intensity will vary between value Ip, when the object 560 is in position Xp and value In when the object 560 is in position Xn. The position gradient $$\frac{\partial I}{\partial x}$$

at the initial relative position Xi may then e.g. be calculated as:

$$\frac{\partial I}{\partial X} = \frac{Ip - In}{Xp - Xn}$$

In an embodiment of the present invention, the position set point as applied to control a position of the first object and/or the position of the second object may thus comprise a dither signal to enable the determination of the gradient at the position corresponding to the position set point. In an embodiment, the dither signal may comprise a multi-dimensional dither signal or periodic signal. Within the meaning of the present invention, a multi-dimensional dither signal refers to a dither signal, or periodic signal, having multiple components or signals associated with multiple different dimensions. As an example, a three-dimensional position set point in X, Y and Z may be applied and, superimposed thereon, a three-dimensional dither signal comprises an X-direction dither signal $A_x*\sin(w_x*t)$, a Y-direction dither signal $A_y*\sin(w_y*t)$ and a Z-direction dither signal $A_z*\sin(w_z*t)$. The position set point PSP applied for controlling an object, e.g. object 560, to a position (Xpsp, Ypsp, Zpsp) may thus become:

$$PSP=(Xpsp+A_x*\sin(w_x*t), Ypsp+A_y*\sin(w_y*t), Zpsp+A_z*\sin(w_z*t)),$$

Wherein:

Ax, Ay, Az=amplitudes of the dither signals applied along X, Y and Z direction respectively, $w_x$, $w_y$, $w_z$=frequencies of the dither signals applied along X, Y and Z direction respectively.

In an embodiment of the present invention, the frequencies as applied in the different dither signals are selected to be different. By doing so, the contributions of the different set point variations or dither signals can be separated, thus enabling to determine the gradient in different dimensions. As an alternative, one could sequentially apply the same dither signal to different dimensions. Note that this might result in a longer measurement sequence to determine the gradient in all required dimensions. In an embodiment, the frequencies of the dither signal or signals are selected not to excite any eigenfrequencies or modes of the object to which the dither signal is applied. In an embodiment, the dither frequencies are selected in a range between 100 Hz and 1500 Hz. In an embodiment, the dither frequencies are multi-sine signals using multiple dither frequencies along each X, Y and Z direction. In an embodiment, the frequencies of the multi-sine signal may be selected around the bandwidth of the position controlled system. The amplitudes Ax, Ay, Az of the dither signals may e.g. be selected in view of a noise-level of the measurement process or system used to obtain the measurement signal. The amplitudes Ax, Ay, Az may e.g. be selected to be at least 3 times higher, preferably at least 5 times higher than the noise-level. In case the method according to the invention includes, as illustrated in step 450 of FIG. 4, an iteration scheme or repetition scheme to arrive at the desired relative position, the applied dither signals may also be varied or changed during said iteration scheme. As such, the applied amplitudes or frequencies of the dither signals may be changed during the iteration scheme.

In an embodiment of the present invention, the gradient can also be determined or approximated without the use of a dither signal. In case a measurement signal is available for at least two different relative positions of the objects, a curve or straight line can be fitted through the measured values and a gradient can be derived thereof. As such, in an embodiment of the present invention, the step of generating the measurement signal may include determining a measurement signal, e.g. an intensity I as illustrated in FIG. 6, at multiple positions at or near the initial relative position and use the measured signals to approximate the gradient at the initial relative position. Alternatively, the method according to the invention may apply the aforementioned dither signals to determine the gradient in the initial relative position but apply a curve fitting method once additional measurement signals, e.g. at further relative positions, are available. In such embodiment, the dither signals need only be applied at the start of the iterative scheme to arrive at the desired relative position.

When the gradient has been determined, e.g. based on measured intensities at different positions, it can be used, as e.g. mentioned in step 430 in FIG. 4, to determine a position set point. In particular, based on the gradient as determined, a position set point can be determined which is closer to the optimal or desired relative position. Referring to FIG. 6, it can be pointed out that the gradient as determined in the initial relative position Xi will have a positive sign, indicating that the maximum intensity value will be to the right, i.e. in the positive X-direction. It can further be pointed out that the closer to the optimal X-position Xopt, the smaller the gradient will become.

When the position set point has been determined, it can e.g. be applied, as illustrated in step 440 in FIG. 4, to control the position of the first object relative to the second object to a further relative position, based on the position set point. With reference to FIG. 6, the position set point as determined based on the gradient in the initial relative position Xi may e.g. be applied to control the second object 560 to a further relative position, indicated as Xf, closer to the optimal relative position Xopt. As indicated in step 450 in FIG. 4, the process of generating a measurement signal, determining a gradient and determining a further position set point can then be repeated at the further relative position, i.e. when the second object 560 is in position Xf.

In an embodiment of the present invention, the objective is to find an optimal or desired relative position of two objects in a lithographic apparatus. As an example, such objects can e.g. be a patterning device and a substrate. Such objects may also be a patterning device holder and a substrate holder. In order to accurately perform an exposure process in a lithographic apparatus, the relative position between the patterning device and the substrate needs to be accurately known and controlled. In particular, a pattern of the patterning device needs to be projected accurately at a desired location on a substrate. As mentioned above, the process of finding the optimal relative position, e.g. an aligned position, may involve applying a measurement beam that is made to interact with a grating or mark on the first object and a grating or mark on the second object. In order to achieve the desired projection of the pattern onto the substrate, a projection system is typically provided along an optical path extending between the patterning device and the substrate. As such, when a measurement beam is applied which e.g. interacts with the gratings on both objects, such a measurement beam will also follow the optical path through the projection system or via the projection system. It has been observed by the inventors that the method according to the invention, i.e. a method for determining a desired relative position between a first object of a lithographic apparatus and a second object of the lithographic apparatus, may also be influenced by an optical system, e.g. a projection system, in case where such a system is present in or along an optical path between the first object and the second object. In particular, the process of determining an optimal relative position may be affected by a position, in particular a varying position, of an optical element of such an optical system that is arranged in an optical path between the first and second object. Within the meaning of the present invention, an optical element can e.g. be a mirror or a lens. Depending on the application, the lens may also be an electrostatic lens, or a magnetic lens. In case the position or orientation of an optical element that is arranged in an optical path between the first object and the second object is not fixed but can vary, one can understand that this positional variation may affect the process of determining the desired or optimal relative position. In such embodiments, the method according to the invention proposes to take account of said varying or variable position of the optical system, e.g. the varying or variable position of one or more optical elements of the optical system, e.g. the projection system.

In order to take account of a variable position of an optical element, it is proposed, in an embodiment of the present invention, to monitor a position of one or more optical elements that are arranged in an optical path between the first object and the second object. Such monitoring may e.g. occur during the application of the dither signal as described above, said dither signal e.g. controlling a position of either the first object, the second object or both. By monitoring the position of one or more optical elements arranged in the optical path between the first object and the second object, account can be taken on the effect of the varying position of the optical element on the measurement or measurements related to the relative position between the first and second object.

As will be appreciated by the skilled person, a varying position of an optical element that is arranged in an optical path between the first object and the second object will cause a variation in measurement signal representing the relative position between the first object and the second object. Referring to FIG. 5, it will be understood that, in case a position or orientation of the optical system 550, or an element thereof, would vary during the measurement sequence, the measurement beam 520.4 leaving the optical system 550 would vary, thus affecting the modified measurement beam 520.3 as received by the radiation sensor 570.

Figure 7:
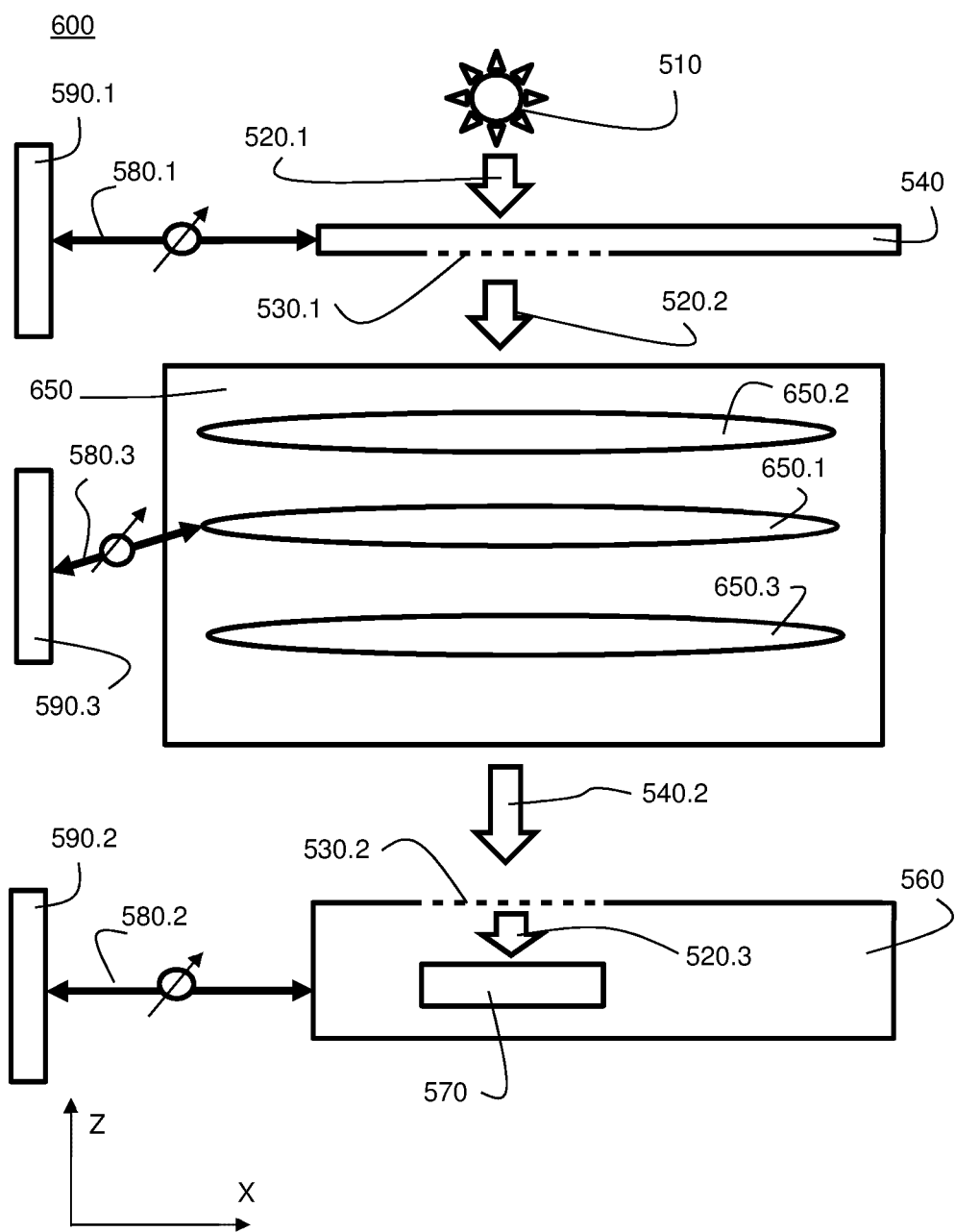
FIG. 7 depicts a further implementation of the method according to the invention.

An embodiment of the present invention whereby positional variations occurring in an optical system can be taken into account is illustrated in FIG. 7. FIG. 7 schematically illustrates a measurement arrangement as can be applied in the present invention to generate a measurement signal representing a relative position between a first object and a second object. The measurement arrangement 600 as schematically shown comprises a light source 510 configured to emit a measurement beam 520.1 to a first grating 530.1, said first grating 530.1 being mounted to a first object 540 or being part of said first object 540. In the embodiment as shown, the measurement beam 520.1 is transmitted through the grating 530.1 and the modified measurement beam 520.2, i.e. modified by the grating 530.1, is directed towards an optical system 650, e.g. a projection system of a lithographic apparatus, and from the optical system 650, indicated by the arrow 520.4, towards a second grating 530.2, said second grating 530.2 being mounted to a second object 560 or being part of said second object 560. In the embodiment as shown, the modified measurement beam 520.4 outputted by the optical system 650 is transmitted through the grating 530.2 and the modified measurement beam 520.3, i.e. modified by the grating 530.2, is received by a radiation sensor 570, e.g. a radiation sensor that is sensitive to the radiation or light emitted by the light source 510. The embodiment as shown comprises a first position measurement system 580.1 to measure a position of the first object 540 relative to a first reference or first reference frame 590.1 and a second position measurement system 580.2 to measure a position of the second object 560 relative to a second reference or second reference frame 590.2, similar to the embodiment of FIG. 5. The position measurement systems 580.1 and 580.2 may be configured to measure the object's position in one or more degrees of freedom, e.g. in 6 degrees of freedom. As will be appreciated by the skilled person, the intensity of the light or radiation as received by the radiation sensor 570 will depend on the position of the first object 540 relative to the second object 560. In particular, when the second object 560, or the first object 540 is displaced along the indicated X-axis, the received intensity will vary Similar gratings may be arranged extending in the Y-direction, the Y-direction being perpendicular to the indicated XZ-plane, resulting in a varying intensity for a displacement in the Y-direction as well. In order to change the position of either the first or second object, one or more positioning devices including actuators or motors can be applied. Such positioning devices may e.g. have a similar structure as the above described positioners PM and PW. In case an optical system such as the optical system 650 is present, the intensity as received by the radiation sensor 570 may also depend on the position of any of the optical elements 650.1, 650.2 and 650.3 of the optical system 650. In the embodiment as shown, the position of the optical element 650.1 can be measured, using a third position measurement system 580.3 as shown. In the embodiment as shown, the third position measurement system 580.3 is configured to measure a position of the optical element 650.1 relative to a third reference 590.3. With respect to the references 590.1, 590.2 and 590.3, it can be pointed out that the positions of the first object 540, the second object 560 and the optical element 650.1 may also be determined relative to the same reference. By measuring the position of the optical element 650.1, one can take account of the effect of any position variation of the optical element on the radiation as received by the radiation sensor 570. Such an effect can e.g. be known based on the design characteristics of the optical system 650, e.g. the characteristics of the optical elements 650.1-650.3 as applied. By taking account of the position or position variation of the optical element or elements of the optical system, a more accurate assessment of the relative position of the first object 540 and the second object 560 can be made. In particular, a more accurate or reliable determination of the desired relative position, e.g. an aligned position, of the first and second object can be obtained, when taking account of the position or position variation of the optical element 650.1. Assuming e.g. that a positional variation of the optical element 650.1 would cause a displacement of the modified measurement beam 520.4 in the indicated X-direction. In such case an assessment of the aligned position of the first object 540 relative to the second object 560 would be flawed in case the optical element 650.1 would not be in its nominal position but in a deviating position. By measuring the actual position of the optical element 650.1 in such case, a correction of the aligned position can be made, based on the measured position of the optical element 650.1. As such, in an embodiment of the present invention, a measurement of the position of the first object and/or the second object is complemented by a measurement of a position of an optical element of an optical system that is arranged in an optical path between the first object and the second object. In such embodiment, the position of the optical element, or optical elements, can be monitored or sampled together with the monitoring or sampling of the position of the first object and the second object, e.g. during the positioning of the first and/or second object using a position set point as described above.

In an embodiment of the present invention, the optical element 650.1 or any other optical element can be considered to be under position control. With other words, the position of the optical element 650.1 can be controlled, e.g. by applying an actuator force to the optical element. So, in such embodiment, in addition to measuring the position of the optical element 650.1, the position may also be changed or adjusted, e.g. using an actuator.

Figure 8:
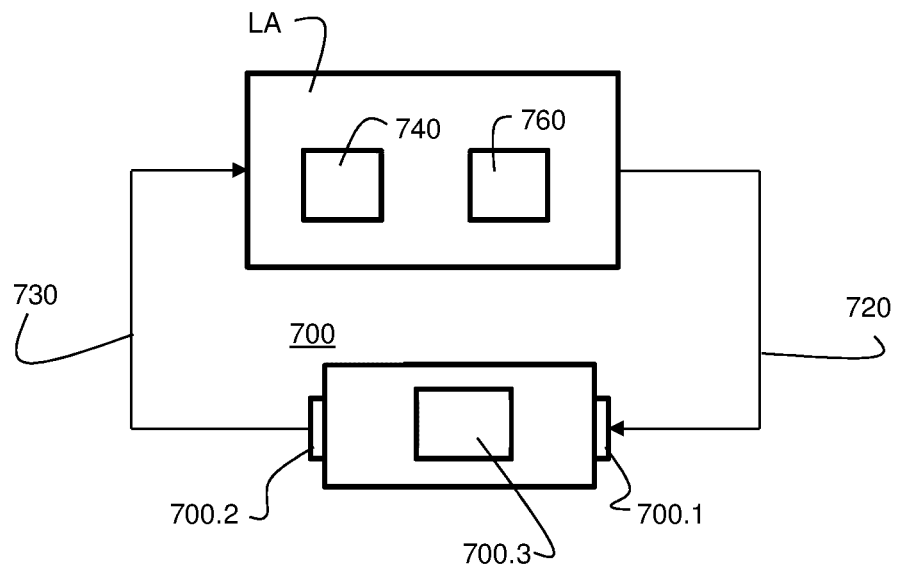
FIGS. 8 and 9 depicts control units as can be applied in embodiments of the present invention.

The methods according to the present invention as illustrated above may e.g. be implemented using a control unit according to the present invention. Such a control unit may e.g. be advantageously be applied to control a relative position of two objects of a lithographic apparatus, e.g. in order to control the relative position to a desired or optimal relative position. FIG. 8 schematically illustrates such a control unit according an embodiment of the present invention, the control unit being configured to control a relative position between two objects of a lithographic apparatus. FIG. 8 schematically shows a lithographic apparatus LA and a control unit 700 according to the present invention. For clarity reasons, the control unit 700 has been drawn separated from the lithographic apparatus LA. In practice, the control unit 700 can be either remote from the lithographic apparatus LA or integrated in the lithographic apparatus LA. In the embodiment as shown, the lithographic apparatus LA comprises a first object 740 and a second object 760. In accordance with the present invention, the control unit 700 is configured to control a relative position of the objects 740 and 760, in order to determine a desired or optimal relative position of the objects.

The control unit 700 according to the present invention may e.g. comprise one or more input terminals 700.1 for receiving signals such as measurement signals, one or more output terminals 700.2 for outputting signals such as control signals and a processing unit 700.3. The control unit 700 according to the present invention may comprise, as the processing unit 700.3, a processor, microprocessor, computer or the like. Such a processing unit 700.3 may e.g. be configured to execute the steps 420, 430, 440 and 450 of the method according to the invention as illustrated in FIG. 4. In particular, the control unit 700 according to the present invention may e.g. be configured to receive, at an input terminal 700.1, a signal such as a measurement signal 720 representing a position of the first object 740 relative to the second object 760, at an initial relative position of the two objects. In an embodiment, the measurement signal 720 may also comprise a signal representing a position of an optical element, e.g. an optical element of an optical system such as a projection system, that is arranged in an optical path between the first object and the second object. The control unit 700 may further be configured to determine, based on the received measurement signal 720:

a gradient associated with the initial relative position, based on the measurement signal 720, a position set point, based on the gradient.

The control unit according to the present invention may further be configured to output, e.g. via the output terminal 700.2 of the control unit 700, a control signal 730 configured to control the position of the first object 740 relative to the second object 760 to a further relative position, the control signal 730 being determined by the control unit 700 based on the position set point.

In an embodiment of the present invention, the process of receiving the measurement signal 720, processing the measurement signal 720 by the processing unit 700.3 to arrive at the control signal 730 and outputting the control signal 730 may be repeated in a fast manner, e.g. leading to a close-to continuous optimisation, whereby the duration of this process can be limited. In particular, the process can be stopped after a predetermined period of time, or after a predetermined number of iterations or when a certain criterion is met, e.g. a value of the gradient dropping below a predetermined threshold.

In an embodiment, the control unit 700 can be configured to apply a dither or periodic signal to the determined position set point, in order to determine the gradient as described above.

Using the control unit 700 according to the present invention facilitates in determining a desired or optimal relative position of two objects of a lithographic apparatus. The control unit 700 can e.g. be applied to align a patterning device such as patterning device MA shown in FIG. 1 with a substrate support such as substrate support WT shown in FIG. 1.

Figure 9:
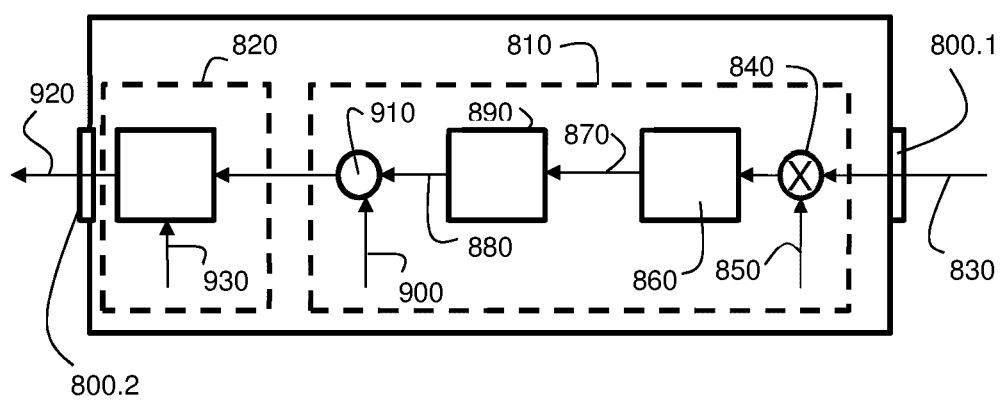

FIG. 9 schematically shows a more detailed embodiment of a control unit according to the present invention. FIG. 9 schematically shows a control unit 800 according to an embodiment of the present invention, the control unit 800 being configured to control a relative position of two objects in a lithographic apparatus, in order to determine a desired or optimal relative position of the objects. The control unit 800 as schematically shown in FIG. 9 comprises a first part 810 which can be referred to as an extremum seeking control unit or optimum seeking control unit and a second part 820 which can be referred to as the position control unit. In the embodiment as shown, the control unit 800 is configured to receive, at an input terminal 800.1, a measurement signal 830, e.g. an intensity signal of an alignment sensor of the lithographic apparatus. The measurement signal 830 may e.g. be a time-varying intensity signal, caused by the use of a dither or periodic signal to a position set point of one of the objects of the lithographic apparatus. In the embodiment as shown, the measurement signal 830 is received by the extremum seeking control unit 810. The extremum seeking control unit 810 as shown is configured to determine a gradient or position gradient from the measurement signal 830 by applying a demodulation 840 of the signal, using the dither signal 850, and by an optional filtering 860, e.g. using a moving average filter. In this respect, reference can e.g. be made to:

R. van der Weijst, T. van Keulen, F. Willems. A generalized framework for perturbation-based derivative estimation in multivariable extremum-seeking. IFAC world congress, 2017, and to:

R. van der Weijst, T. van Keulen, F. Willems. Constrained multivariable extremum-seeking for online fuel-efficient optimization of Diesel engines. Control Engineering Practice, 2019.

The extremum seeking control unit 810 is further configured to determine, based on the gradient 870, a position set point 880, by using an integrator 890. A dither signal 900 is then added via addition point 910 to the position set point 880 and the combination of the position set point 880 and the dither signal 900 is provided to the position control unit 820 which converts the position set point to a control signal 920 which is outputted via the output terminal 800.2 and which controls the relative position of the objects of the lithographic apparatus. In an embodiment, the position set point 880 may be a position offset which can be added to a previous position set point, e.g. an initial position set point as e.g. obtained from a coarse alignment process. The position control unit 820, which may also be referred to as a servo control unit may e.g. include a feedforward loop and a feedback loop. The position control unit 820 may further comprise, in order to determine the control signal 920, a position measurement signal 930 representing a position of one of the objects that is controlled. In an embodiment, the position measurement signal may also comprise a position measurement of an optical element arranged in an optical path between the objects. Such a position measurement signal 930 may also be provided to the control unit 800 via an input terminal such as input terminal 800.1. In an embodiment of the present invention, the position measurement signal 930 as provided to the control unit 800, and/or the measurement signal 830 can be multi-dimensional signals, representing a position in multiple degrees or freedom, or a measured intensity associated with such a position. The measured intensity may e.g. be associated with a three-dimensionally characterised position, in x, y, z.

The control unit according to the present invention enables to find a desired or optimal relative position between two objects of a lithographic apparatus by applying an extremum seeking approach, the extremum seeking approach being based on a gradient assessment. Starting from an initial position, the relative position is gradually changed, based on a calculated gradient. The performance of such an approach has been compared to an approach whereby an area or volume that is deemed to contain the optimal relative position is scanned, thereby determining measurement signals across the area or volume, and a model fitting is subsequently applied to determine a location of the optimal relative position. The method according to the present invention is deemed to have one or more of the following advantages over the model fitting approach:

- The method according to the present invention does not rely on a model fitting, the accuracy of the method is thus not compromised by any assumptions made to obtain the model. As a result, the accuracy of the method according to the invention has been found to be superior to the model fitting approach.
- The method according to the invention enables to obtain the desired relative position substantially without an excitation of eigenfrequencies or modes of the objects that are controlled. In particular, the frequencies of the applied dither signals or periodic signals can be selected to avoid such excitation.
- The method according to the invention has been found to converge to the desired relative position in a shorter period than required to perform the areal or volume scan.
- The method according to the invention does not rely on the accuracy of the tracking of such areal or volume scan.

According to an aspect of the present invention, there is provided a stage apparatus comprising a support for supporting an object and a control unit according to the invention. Using such a stage apparatus enables to determine a desired relative position, e.g. an aligned position, between an object of a lithographic apparatus, e.g. a patterning device, and the support. The support can e.g. be a substrate support such as substrate support WT shown in FIG. 1.

The present invention may also advantageously be applied in apparatuses or systems that enable or facilitate the operation of a lithographic apparatus. As such, in an embodiment of the present invention, there is provided a system comprising an inspection apparatus configured to provide a beam on a diffraction measurement target on a substrate and to detect radiation diffracted by the target to determine a parameter of a lithographic process and a first object, a second object and a control unit according to the present invention.

According to yet another aspect of the invention, there is provided an apparatus comprising a control unit according to the invention, wherein the apparatus is a lithographic apparatus, a metrology apparatus, an inspection apparatus, a particle beam apparatus, or a particle beam inspection apparatus. In such an apparatus, the control unit according to the invention can be configured to optimise a relative position between two objects of the apparatus or in the apparatus, according to the method according to the invention. In an embodiment, such an apparatus can e.g. be equipped with a stage apparatus according to the present invention.

In the example as shown in FIG. 6, the optimal or desired relative position between a first object and a second object was deemed to be found where a measurement signal has an optimum, either a maximum or a minimum. In an alternative embodiment of the present invention, the optimal or desired relative position does not correspond to an optimum of the measurement signal but rather corresponds to an optimum of a cost function. In such embodiment, the cost function may represent a desired characteristic or property that depends on the relative position of two objects in a lithographic apparatus. In such embodiment, the cost function is evaluated using the measurement signal and a gradient of the cost function is calculated to determine a further position set point or direction in which to displace or reposition the objects, in order to arrive at the desired characteristic or property.

As an example, it may be desired, in a lithographic apparatus, to irradiate a patterning device or a substrate with a radiation beam or patterned radiation beam having a particular spatial or angular intensity distribution. Typically, a lithographic apparatus comprises a plurality of optical elements such as lenses or mirrors which can be used to shape a radiation beam or patterned radiation beam. The illumination system IL or the projection system PS as described above may e.g. comprise such optical elements. A lithographic apparatus may further comprise one or more sensors to determine an intensity distribution of a cross-section of a radiation beam. When such an intensity distribution is measured for a plurality of relative positions of two or more of such optical elements, the measured intensity distribution can be evaluated, using the cost function, and a gradient can be determined based on the cost function, the gradient being indicative for a direction or further relative position of the optical elements which would result in a more extreme value for the cost function. The cost function may e.g. be a mathematical description of the desired intensity distribution, e.g. describing an harmonic content of the spatial or angular intensity distribution.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Other aspects of the invention are set-out as in the following numbered clauses.

1. Method of determining a desired relative position between a first object of a lithographic apparatus and a second object of the lithographic apparatus, the method comprising:
   a. generating a measurement signal representing a position of the first object relative to the second object, at an initial relative position;
   b. determining a gradient associated with the initial relative position, based on the measurement signal;
   c. determining a position set point based on the gradient;
   d. controlling the position of the first object relative to the second object to a further relative position, based on the position set point.
2. The method according to clause 1, further comprising:
   e. repeating steps b to d for the further relative position during a predetermined period, or for a predetermined number of times or until the gradient meets a predetermined criterion.
3. The method according to clause 1 or 2, wherein the gradient comprises a gradient of the measurement signal.
4. The method according to clause 1 or 2, wherein the desired relative position is represented by an optimum of a cost function, the gradient comprising a gradient of the cost function.
5. The method according to any of the preceding clauses, wherein the step of generating the measurement signal comprises:
   emitting a measurement beam towards the first object or the second object; and
   receiving a modified measurement beam, the modified measurement beam being modified by both the first and second object.
6. The method according to clause 5, wherein the measurement beam has been modified to the modified measurement beam by passing through a grating of the first object and a grating of the second object.
7. The method according to clause 6, wherein the first object is a patterning device mounted to a support of the lithographic apparatus and wherein the second object is a substrate support of the lithographic apparatus.
8. The method according to any of the preceding clauses, wherein the position set point comprises a dither signal.
9. The method according to clause 8, wherein the dither signal comprises a three-dimensional dither signal.
10. The method according to clause 9, wherein the three-dimensional dither signal comprises an X-direction dither signal $A_x*\sin(w_x*t)$, a Y-direction dither signal $A_y*\sin(w_y*t)$ and a Z-direction dither signal $A_z*\sin(w_z*t)$.
11. The method according to clause 10, wherein the X-direction dither signal, the Y-direction dither signal and the Z-direction dither signal are sequentially applied.
12. The method according to clause 10, wherein $w_x$, $w_y$ and $w_z$ have different values.
13. The method according to clause 12, wherein $w_x$, $w_y$ and $w_z$ are in a range between 100 Hz and 1500 Hz.
14. The method according to any of the clauses 10 to 13, wherein the amplitudes $A_x$, $A_y$ and $A_z$ are at least 3 times larger than a noise-level of the measurement signal, preferable at least 5 times.
15. The method according to any of the clauses 8 to 14, wherein the measurement signal comprises a time-varying intensity associated with a time-varying relative position between the first object and the second object, the time-varying relative position being caused by the dither signal of the relative position set point.
16. The method according to clause 15, wherein the gradient is determined based on the time-varying intensity of the measurement signal and the dither signal.
17. The method according to any of the preceding clauses, wherein the desired relative position comprises an aligned position of the first object and the second object.
18. The method according to clause 17, wherein the measurement signal comprises an optimum when the first object and the second object are in the aligned position.
19. The method according to any of the preceding clauses, wherein the measurement signal further comprises a signal representing a position of an optical element arranged in an optical path between the first object and the second object.
20. Control unit for controlling a relative position between a first object of a lithographic apparatus and a second object of a lithographic apparatus, the control unit being configured to:
    a. receive, at an input terminal of the control unit, a measurement signal representing a position of the first object relative to the second object, at an initial relative position;

b. determine a gradient associated with the initial relative position, based on the measurement signal;
c. determine a position set point, based on the gradient;
d. output, at an output terminal of the control unit, a control signal configured to control the position of the first object relative to the second object to a further relative position, the control signal being based on the position set point.

21. The control unit according to clause 20, wherein the control unit is further configured to
e. repeat steps a to d for the further relative position during a predetermined period, or for a predetermined number of times or until the gradient meets a predetermined criterion.

22. The control unit according to any of the clauses 20 to 21, wherein the gradient comprises a gradient of the measurement signal.

23. The control unit according to any of the clauses 20 to 21, wherein the desired relative position is represented by an optimum of a cost function, the gradient comprising a gradient of the cost function.

24. The control unit according to any of the clauses 20 to 23, wherein the control unit is configured to include a dither signal to the position set point.

25. The control unit according to clause 24, wherein the dither signal comprises a three-dimensional dither signal.

26. The control unit according to clause 25, wherein the three-dimensional dither signal comprises an X-direction dither signal $A_x*\sin(w_x*t)$, a Y-direction dither signal $A_y*\sin(w_y*t)$ and a Z-direction dither signal $A_z*\sin(w_z*t)$.

27. The control unit according to clause 25 or clause 26, wherein the X-direction dither signal, the Y-direction dither signal and the Z-direction dither signal are sequentially applied.

28. The control unit according to clause 26, wherein $w_x$, $w_y$, and $w_z$ have different values.

29. The control unit according to clause 28, wherein $w_x$, $w_y$, and $w_z$ are in a range between 100 Hz and 1500 Hz.

30. The control unit according to any of the clauses 20 to 29, wherein the measurement signal comprises a time-varying intensity associated with a time-varying relative position between the first object and the second object, the time-varying relative position being caused by the dither signal of the relative position set point.

31. The control unit according to clause 30, wherein the gradient is determined based on the time-varying intensity of the measurement signal and the dither signal.

32. The control unit according to any of the clauses 20 to 31, wherein the measurement signal comprises a signal representing a position of an optical element arranged in an optical path between the first object and the second object.

33. A stage apparatus for use in a lithographic apparatus, the stage apparatus comprising:
a support configured to hold an object, and
a control unit according to any of the clauses 20 to 32, wherein the control unit is configured to control a relative position between an object of the lithographic apparatus and the support.

34. A lithographic apparatus comprising:
a first object;
a second object;
a control unit according to any of the clauses 20 to 32.

35. The lithographic apparatus according to clause 34, wherein the first object comprises a patterning device and wherein the second object comprises a substrate support.

36. The lithographic apparatus according to clause 34 or 35, wherein the apparatus comprises a projection system, the first object and the second object being optical components of the projection system.

37. The lithographic apparatus according to clause 34, wherein the apparatus comprises a projection system, the first object being an optical component of the projection system and wherein the second object comprises a patterning device or a substrate support.

38. A system comprising: an inspection apparatus configured to provide a beam on a diffraction measurement target on a substrate and to detect radiation diffracted by the target to determine a parameter of a lithographic process; and a first object; a second object; a control unit according to any of the clauses 20 to 32.

39. An apparatus comprising a control unit according to any of the clauses 20 to 32 wherein the apparatus is a lithographic apparatus, a metrology apparatus, an inspection apparatus, a particle beam apparatus, or a particle beam inspection apparatus.

The invention claimed is:

1. A method of determining comprising:
generating a measurement signal representing a position of a first object of a lithographic apparatus relative to a second object of the lithographic apparatus, at an initial relative position;
determining a gradient associated with the initial relative position, based on the measurement signal;
determining a position set point based on the gradient, wherein the position set point comprises a three-dimensional dither signal; and
controlling the position of the first object relative to the second object to a further relative position, based on the position set point.

2. The method of claim 1, wherein the gradient comprises a gradient of the measurement signal.

3. The method of claim 1, wherein the generating the measurement signal comprises:
emitting a measurement beam towards the first object or the second object; and
receiving a modified measurement beam, the modified measurement beam being modified by both the first and second object.

4. The method of claim 1, wherein the three-dimensional dither signal comprises an X-direction dither signal $A_x*\sin(w_x*t)$, a Y-direction dither signal $A_y*\sin(w_y*t)$ and a Z-direction dither signal $A_z*\sin(w_z*t)$.

5. The method of claim 4, wherein the X-direction dither signal, the Y-direction dither signal and the Z-direction dither signal are sequentially applied.

6. The method of claim 4, wherein $w_x$, $w_y$ and $w_z$ have different values.

7. The method of claim 4, wherein $w_x$, $w_y$, and $w_z$ are in a range between 100 Hz and 1500 Hz.

8. The method of claim 4, wherein the amplitudes $A_x$, $A_y$, and $A_z$ are at least 3 times larger than a noise-level of the measurement signal, preferably at least 5 times.

9. The method of claim 1, wherein the measurement signal comprises a time-varying intensity associated with a time-varying relative position between the first object and the second object, the time-varying relative position being caused by the dither signal of the position set point.

10. The method of claim 1, wherein the gradient is determined based on the time-varying intensity of the measurement signal and the dither signal.

11. A system comprising:
a control unit configured to control a relative position between a first object of a lithographic apparatus and a second object of the lithographic apparatus, the control unit being configured to:
receive, at an input terminal of the control unit, a measurement signal representing a position of the first object relative to the second object, at an initial relative position;
determine a gradient associated with the initial relative position, based on the measurement signal;
determine a position set point, based on the gradient, wherein the position set point comprises a three-dimensional dither signal; and
output, at an output terminal of the control unit, a control signal configured to control the position of the first object relative to the second object to a further relative position, the control signal being based on the position set point.

12. The control unit of claim 11, wherein the three-dimensional dither signal comprises an X-direction dither signal $A_x*\sin(w_x*t)$, a Y-direction dither signal $A_y*\sin(w_y*t)$ and a Z-direction dither signal $A_z*\sin(w_z*t)$.

13. The control unit of claim 12, wherein the X-direction dither signal, the Y-direction dither signal and the Z-direction dither signal are sequentially applied.

14. The control unit of claim 12, wherein $w_x$, $w_y$ and $w_z$ have different values.

15. The control unit of claim 12, wherein $w_x$, $w_y$ and $w_z$ are in a range between 100 Hz and 1500 Hz.

16. The control unit of claim 12, wherein the measurement signal comprises a time-varying intensity associated with a time-varying relative position between the first object and the second object, the time-varying relative position being caused by the dither signal of the position set point.

17. The control unit of claim 16, wherein the gradient is determined based on the time-varying intensity of the measurement signal and the dither signal.

18. A lithographic apparatus comprising:
a first object;
a second object; and
a control unit configured to control a relative position between a first object of a lithographic apparatus and a second object of the lithographic apparatus, the control unit being configured to:
receive, at an input terminal of the control unit, a measurement signal representing a position of the first object relative to the second object, at an initial relative position;
determine a gradient associated with the initial relative position, based on the measurement signal;
determine a position set point, based on the gradient, wherein the position set point comprises a three-dimensional dither signal; and
output, at an output terminal of the control unit, a control signal configured to control the position of the first object relative to the second object to a further relative position, the control signal being based on the position set point.

19. The lithographic apparatus of claim 18, wherein:
the apparatus comprises a projection system, and
the first object and the second object are optical components of the projection system.

20. An apparatus comprising:
a control unit configured to control a relative position between a first object of a lithographic apparatus and a second object of the lithographic apparatus, the control unit being configured to:
receive, at an input terminal of the control unit, a measurement signal representing a position of the first object relative to the second object, at an initial relative position;
determine a gradient associated with the initial relative position, based on the measurement signal;
determine a position set point, based on the gradient, wherein the position set point comprises a three-dimensional dither signal; and
output, at an output terminal of the control unit, a control signal configured to control the position of the first object relative to the second object to a further relative position, the control signal being based on the position set point,
wherein the apparatus is a lithographic apparatus, a metrology apparatus, an inspection apparatus, a particle beam apparatus, or a particle beam inspection apparatus.

* * * * *